(12) United States Patent
Xie et al.

(10) Patent No.: US 9,349,615 B2
(45) Date of Patent: May 24, 2016

(54) SIP SYSTEM-INTEGRATION IC CHIP PACKAGE AND MANUFACTURING METHOD THEREOF

(75) Inventors: Jianyou Xie, Gansu (CN); Xizhou Li, Gansu (CN); Wei Mu, Gansu (CN); Yongzhong Wang, Gansu (CN); Haidong Wei, Gansu (CN)

(73) Assignee: TIANSHUI HUATIAN TECHNOLOGY CO., LTD., Tianshui (CN)

( * ) Notice: Subject to any disclaimer, the term of this patent is extended or adjusted under 35 U.S.C. 154(b) by 63 days.

(21) Appl. No.: 13/883,143

(22) PCT Filed: Dec. 30, 2010

(86) PCT No.: PCT/CN2010/080520
§ 371 (c)(1),
(2), (4) Date: May 2, 2013

(87) PCT Pub. No.: WO2012/068762
PCT Pub. Date: May 31, 2012

(65) Prior Publication Data
US 2013/0214386 A1    Aug. 22, 2013

(30) Foreign Application Priority Data
Nov. 26, 2010    (CN) .......................... 2010 1 0561304

(51) Int. Cl.
*H01L 29/00* (2006.01)
*H01L 21/56* (2006.01)
*H01L 25/065* (2006.01)
(Continued)

(52) U.S. Cl.
CPC .......... *H01L 21/565* (2013.01); *H01L 25/0652* (2013.01); *H01L 25/0655* (2013.01);
(Continued)

(58) Field of Classification Search
CPC ......... H01L 51/56; H01L 33/32; H01L 33/62; H01L 51/0072; H01L 2251/558
USPC .......................... 257/528, 723, 724, E21.505
See application file for complete search history.

(56) References Cited

U.S. PATENT DOCUMENTS

2006/0261454 A1* 11/2006 Takiar .............. G06K 19/07732
257/678
2009/0079066 A1    3/2009 Jang

FOREIGN PATENT DOCUMENTS

CN    1437232 A    8/2003
CN    2711906 Y    7/2005

*Primary Examiner* — Andy Huynh
(74) *Attorney, Agent, or Firm* — Hamre, Schumann, Meuller & Larson, P.C.

(57) ABSTRACT

A system-in-package (SiP) system-integration integrated circuit (IC) chip package and a manufacturing method thereof are provided. The package includes a substrate, a passive device and two IC chips are provided on the substrate, an adhesive film is disposed between each of the two IC chips and the substrate, the IC chips are connected to first pads on the substrate through bonding wires, and the substrate is covered by a mold cap. A third IC chip may be further disposed on one of the IC chips, and the third IC chip is connected to the first pad and the IC chip under the third IC chip respectively through a bonding wire. A substrate adopting a surface mount technology (SMT) PAD window-opening manner is used, chip mounting is performed on the substrate, and the substrate undergoes reflow soldering, cleaning, die bonding, plasma cleaning, bonding, marking, cutting, and packing, so that the SiP system-integration IC chip package is manufactured. The package of the present invention integrates devices of different types, has a complete system function, and can be used as a middle stage of further development of system on chip (SoC).

4 Claims, 1 Drawing Sheet

(51) Int. Cl.
  *H01L 27/04*   (2006.01)
  *H01L 23/31*   (2006.01)
  *H01L 23/00*   (2006.01)
  *H01L 23/498*  (2006.01)

(52) U.S. Cl.
  CPC .......... *H01L27/04* (2013.01); *H01L 23/3121* (2013.01); *H01L 23/49811* (2013.01); *H01L 24/29* (2013.01); *H01L 24/32* (2013.01); *H01L 24/45* (2013.01); *H01L 24/48* (2013.01); *H01L 24/73* (2013.01); *H01L 24/92* (2013.01); *H01L 25/0657* (2013.01); *H01L 2223/5442* (2013.01); *H01L 2223/54486* (2013.01); *H01L 2224/2919* (2013.01); *H01L 2224/32145* (2013.01); *H01L 2224/32225* (2013.01); *H01L 2224/45015* (2013.01); *H01L 2224/45144* (2013.01); *H01L 2224/45147* (2013.01); *H01L 2224/48145* (2013.01); *H01L 2224/48227* (2013.01); *H01L 2224/73215* (2013.01); *H01L 2224/73265* (2013.01); *H01L 2224/92247* (2013.01); *H01L 2225/0651* (2013.01); *H01L 2225/06506* (2013.01); *H01L 2924/01047* (2013.01); *H01L 2924/01079* (2013.01); *H01L 2924/10253* (2013.01); *H01L 2924/1531* (2013.01); *H01L 2924/19105* (2013.01); *H01L 2924/3011* (2013.01); *H01L 2924/3511* (2013.01)

SIP SYSTEM-INTEGRATION IC CHIP PACKAGE AND MANUFACTURING METHOD THEREOF

BACKGROUND OF THE INVENTION

1. Field of Invention

The present invention relates to the technical field of integrated circuit (IC) package, and relates to a system-in-package (SiP) system-integration IC chip package, so that the circuit package proceeds to system-integration scale from single-chip scale. The present invention further relates to a manufacturing method of the SiP system-integration IC chip package.

2. Related Art

Continuous demands on small and multi-functional electronic products, especially portable products such as computers and communication apparatuses, give rise to new requirements on integrated circuits (ICs), and it is required to implement functions of a system on a chip. Because of the improvement of the IC design level and process technique, the IC has an increasingly large scale, and the whole system can be integrated on one chip. Recently, from the viewpoint of design, the integration of the whole system on one chip is mainly implemented by system on chip (SoC); however, the design for the SoC requires the time of up to 18 months and huge Non-Recurring Engineering expense (NRE expense), which affects the wide application of the SoC. A system-in-package (SiP) design of assembling one or more bare chips on a substrate, as well as several separated and passive components, only requires 6 to 9 months. By means of vertical integration, the SiP can also reduce the interconnection distance, signal delay time, noise, as well as capacity effect, so that the signal speed is faster and the power consumption is lower. Sometimes, the SiP, as a middle stage of further development of the SoC, integrates all content into one silicon chip, which is undoubted in a Bluetooth device, a mobile phone, an automobile electronic, imaging and displaying product, and a digital camera and power supply. The SiP meets package requirements of the applications, and compared with the convention IC package, the SiP can mostly save assets by 80% and reduce the weight by 90%. One of the key reasons is adoption of the surface mount technology (SMT). The SiP technology integrates the SMT of electronic manufacturing service (EMS) and the semiconductor assembling service (SAS). The SiP, by stacking memories and logic chips together, meets the requirements of various applications. However, devices packaged in the convention SiP package have single functions, and only devices of the same type can be packaged, so that a system function of the package is incomplete.

SUMMARY OF THE INVENTION

The present invention is directed to a SiP system-integration package, which integrates a memory chip, a CPU, an encryption chip and a decoding chip, has a complete system function, and can be used as a middle stage of further development of SoC.

The present invention is further directed to a manufacturing method of the integrated package.

In order to implement the above objectives, the present invention adopts the following technical solution. A SiP system-integration IC chip package includes a substrate 1, the substrate 1 is provided with a passive device and two IC chips, an adhesive film is disposed between each of the two IC chips and the substrate 1, the IC chips are connected to first pads 6 on the substrate 1 through bonding wires, and the substrate 1 is covered by a mold cap 13.

Another technical solution adopted in the present invention is a manufacturing method of the SiP system-integration IC chip package, which includes the following steps.

Step 1: Wafer Grinding

When the wafer grinding requires the thickness being less than or equal to 160 μm, a PG300RM grinding machine and the conventional grinding process are used to perform grinding on a wafer. A CP9021B-200 dedicated grinding adhesive film with the specification being 230 mm×100 m and the thickness being 200 μm is adopted, and grinding is performed on a surface of the dedicated grinding adhesive film by using the conventional processes of rough grinding, fine grinding, and polishing, so that the surface roughness of the dedicated grinding adhesive film becomes 0.05 μm-0.12 μm, and the dedicated grinding adhesive film after grinding is adhered to a surface of the grinded wafer.

When the wafer grinding requires the thickness being greater than 160 μm, a PG300RM grinding machine and the conventional grinding process are used to perform grinding on a wafer. A BT-150E-KL grinding adhesive film with the specification being 230 mm×100 m and the thickness being 150 μm is adopted, and grinding is performed on a surface of the grinding adhesive film by using the conventional process, so that the surface roughness of the grinding adhesive film becomes 0.05 μm-0.12 μm, and the grinding adhesive film after grinding is adhered to a surface of a chip after the wafer grinding.

Step 2: When the grinding thickness of the wafer is less than or equal to 160 μm, perform wafer sawing with a DFD3350 dual-blade dicing saw, and bake after wafer sawing.

When the grinding thickness of the wafer is greater than 160 μm, perform wafer sawing with a DAD6340 common dicing saw, and bake after wafer sawing.

Step 3: Use a substrate adopting an SMT PAD window-opening manner, where the substrate has the specification as that: 0201, indicating a non-solder mask define pad structure, and 0402, indicating a solder mask define pad structure, use an XPf-s chip mounter, print solder paste on related pads on the substrate, and attach passive devices, in an ascending order of size, to the pads with the solder paste printed. Then, feed the substrate with the chips mounted into a Pyramax reflow oven to perform reflow soldering, where the temperature of reflow is 230° C.-250° C., and the time of reflow is 30s-50s.

Clean the substrate after reflow by using BL-370 cleaning agent, so as to remove flux residue. During the cleaning, the transporting speed is 0.45 m/min, and the cleaning temperature is 35-45° C. Dry the substrate after cleaning at the temperature of 40-50° C.

Step 4: Place the wafer after wafer sawing in Step 2 into a work room of a die bonding machine; transfer the substrate cleaned in Step 3 to a loading table, clamp an epoxy tube, observe under a microscope, rotate to adjust the position of the chip, dispense the epoxy at chip attachment positions by using an epoxy dispensing system, eject the chip by using a conventional multi-ejector pin system and multi-step ejection system, and place the chip at the chip attach positions on the substrate when the chip is ejected.

Step 5: Perform plasma cleaning, by using a conventional method, on the substrate after die bonding in Step 4.

Step 6: Take a bonding wire, perform bonding by using a chip-to-chip wiring technique and a cross-chip wiring technique, and perform Design of Experiment (DOE) optimization on a loop of the bonding wire, where the loop height is controlled to be 100 μm-150 μm; and Perform bonding by using an ESEC3100 bonding machine.

Step 7: Use a molding compound with a linear expansion coefficient being al≤1, viscosity ≥8000 cp, and liquidity being 80 cm-120 cm, and perform molding, by using an automatic molding system with vacuum absorption, on the substrate after bonding in Step 6, where during the molding, the conventional multi-condition injection anti-warping software control technique should be adopted to control wire sweep, warping, and delaminating. In a post mold curing procedure, tightly clamp the molded package by using an anti-warping dedicated curing fixture, and perform post mold curing for 4 hours to 7 hours at the temperature of 175° C.+10° C., so as to prepare a whole bar of semi-finished product of the SiP system-integration package.

The molding compound adopts the commonly available CEL9250 molding compound and the commonly available EME EF0324906 molding compound.

Step 8: Mark, by using LMK-54 marking equipment, characters on the whole bar of semi-finished product of the SiP system-integration package prepared in Step 7.

Step 9: Perform taping, by using MWM-850 taping equipment of the AE Company, on a surface of the whole bar of semi-finished product of the SiP system-integration package after marking in Step 9; saw, by using AD3350 sawing equipment of the DISCO Company, the whole bar of semi-finished product of the SiP system-integration package after taping on the surface; perform cleaning by using DCS1440 cleaning equipment of the DISCO Company; perform UV irradiation by using UV-956 irradiation equipment of the AE Company; perform picking and sorting; and finally, perform air-drying by using an ion blower.

Step 10: Perform packing by using an anti-static vacuum packing process of a common package, so as to obtain the SiP system-integration IC chip package.

The manufacturing method of the integrated package of the present invention is a novel package technology based on SoC, in which high-performance modules composed of one or more bare chips and passive devices are loaded into one package case, so as to possess functions of a system. The design time is shortened to only 6 to 9 months. The vertical integration reduces the interconnection distance, signal delay time, noise as well as capacity effect, so that the signal speed is faster, and the power consumption is reduced.

Figure 1:
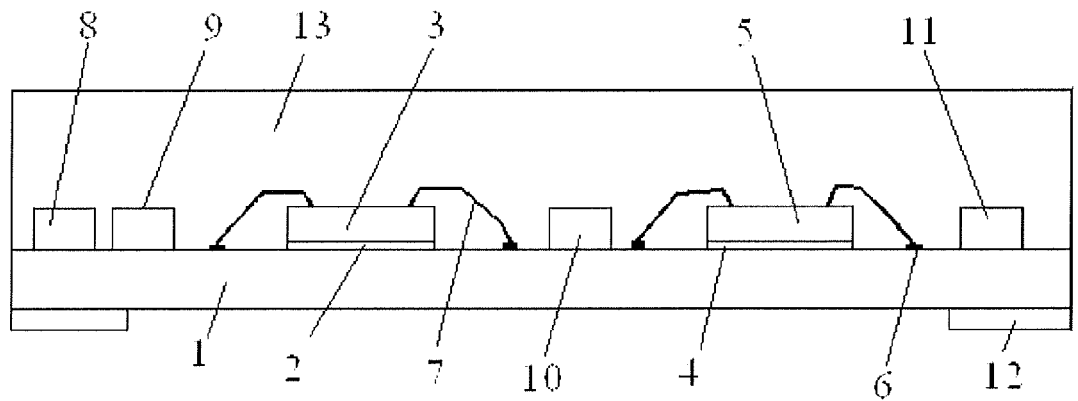
FIG. 1 is a schematic structural diagram of an embodiment of a multi-chip package according to the present invention.

In reference numerals of the drawings, 1 represents a substrate, 2 represents a first adhesive film, 3 represents a first IC chip, 4 represents a second adhesive film, 5 represents a second IC chip, 6 represents a first pad, 7 represents a first bonding wire, 8 represents a first passive device, 9 represents a second passive device, 10 represents a third passive device, 11 represents a fourth passive device, 12 represents a second pad, 13 represents a mold cap, 14 represents a third IC chip, 15 represents a third adhesive film, 16 represents a second bonding wire, 17 represents a solder ball, and 18 represents a third bonding wire.

DETAILED DESCRIPTION OF THE INVENTION

The present invention is illustrated in detail through accompanying drawings and specific implementations as follows.

SiP is a result of blending and comprehensive application of knowledge, techniques and methods during the development the IC industrial chain, and can take advantages of various chip resources and package interconnections flexibly to the maximum extent, thereby improving the performance and reducing the cost as much as possible. In the procedure of deep and thorough research and development, various technical problems are involved, and related techniques include thermal design, redistribution of I/O interfaces, grinding of the back thickness of a large-scale IC chip, lamination assembling of several chips, high-density interconnection technique, and the like.

The SiP packages multiple ICs and passive elements on a high-performance substrate, being conveniently compatible with chips manufactured by different manufacturing techniques, so that the package proceeds to a system integration stage from a single chip stage. The SiP is actually a system-stage multi-chip package (MCP), and has the significantly improved packaging efficiency. The SiP stacks a micro-processor or a digital signal processor with various memories during packaging, so that the SiP can run separately as a micro-system.

FIG. 1 shows a structure of an embodiment of a multi-chip package according to the present invention, which includes a substrate 1. Two second pads 12 are disposed in parallel under the substrate 1, and a first IC chip 3 and a second IC chip 5 are disposed in parallel on the substrate 1. The substrate 1 is further provided with a first passive device 8, a second passive device 9, a third passive device 10, and a fourth passive device 11. A first adhesive film 2 is disposed between the first IC chip 3 and the substrate 1, and a second adhesive film 4 is disposed between the second IC chip 5 and the substrate 1. A first pad 6 is disposed on the substrate 1 at both sides of the first IC chip 3 respectively, and the first pad 6 is also disposed on the substrate 1 at both sides of the second IC chip 5 respectively. Multiple first bonding wires 7 are soldered on the first IC chip 3, and the multiple first bonding wires 7 each have one end fixed to the first IC chip 3 and the other end soldered to the first pads 6 at the both sides of the first IC chip 3 respectively. Multiple first bonding wires 7 are also soldered on the second IC chip 5, and the multiple bonding wires 7 each have one end fixed to the second IC chip 5 and the other end soldered to the first pads 6 at both sides of the second IC chip 5 respectively. The substrate 1 is covered by a mold cap 13, and the mold cap 13 encloses the upper surface of the substrate 1 and all devices disposed on the surface.

Figure 2:
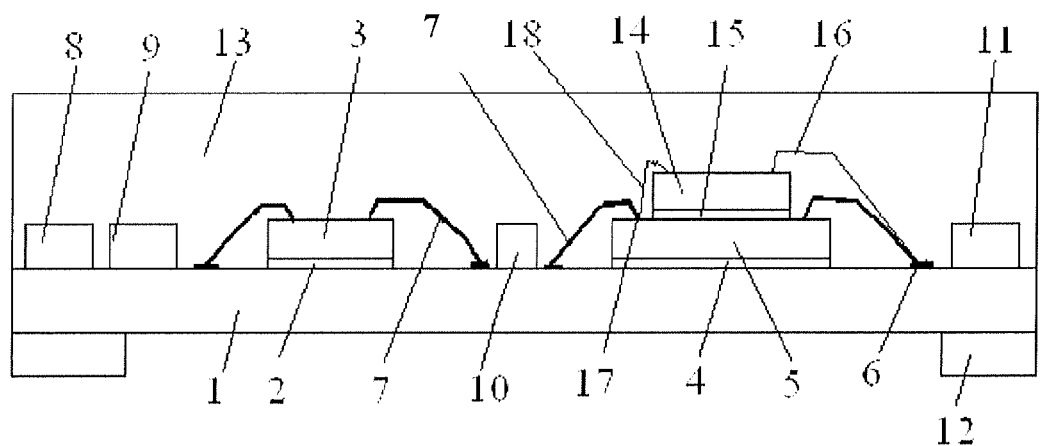
FIG. 2 is a schematic structural diagram of an embodiment of a stacked package according to the present invention.

FIG. 2 shows a structure of an embodiment of a stacked package according to the present invention, which includes a substrate 1. Two second pads 12 are disposed in parallel under the substrate 1, and a first IC chip 3 and a second IC chip 5 are disposed in parallel on the substrate 1. The substrate 1 is further provided with a first passive device 8, a second passive device 9, a third passive device 10 and a fourth passive device 11. A first adhesive film 2 is disposed between the first IC chip 3 and the substrate 1, and a second adhesive film 4 is disposed between the second IC chip 5 and the substrate 1. A third IC chip 14 is disposed on the second IC chip 5, and a third tape 15 is disposed between the third IC chip 14 and the second IC chip 5. A first pad 6 is disposed on the substrate 1 at both sides of the first IC chip 3 respectively, and the first pad 6 is also disposed on the substrate 1 at both sides of the second IC chip 5 respectively. Multiple first bonding wires 7 are soldered on the first IC chip 3, and the multiple first bonding wires 7 each have one end fixed to the first IC chip 3 and the other end soldered to the first pads 6 at the both sides of the first IC chip 3 respectively. Multiple first bonding wires 7 are also soldered on the second IC chip 5, and the multiple first bonding wires 7 each have one end fixed to the second IC chip 5 and the other end soldered to the first pads 6 at both sides of the second IC chip 5 respectively. A solder ball 17 is disposed on the second IC chip 5. Multiple second bonding wires 16 and multiple third bonding wires 18 are respectively disposed on the third IC chip 14, where the second bonding wires 16 each have one end fixed to the third IC chip 14 and the other end soldered to the first pad 6 at one side of the second IC chip 5, and the third bonding wires 18 each have one end fixed to the third IC chip 14 and the other end soldered to the solder ball 17. The substrate 1 is covered by a mold cap 13, and the mold cap 13 encloses the upper surface of the substrate 1 and all devices disposed on the surface.

The first bonding wires 7, the second bonding wires 16, and the third bonding wires 18 all adopt gold wires or copper wires.

The first adhesive film 2, the second adhesive film 4 and the third adhesive film 15 all adopt a DAF (die attach film) adhesive film.

The mold cap 13 protects and supports the IC chips, the bonding wires and the substrate 1.

The IC chips, the bonding wires, the substrate 1, the second pads 12 and the passive device form a power supply and signal channel.

The adhesive films, the bonding wires, the first pads 6, the second pads 12 and the solder ball 17 form a circuit as a whole.

The present invention further provides a manufacturing method of the above package, which is performed according to the following steps.

Step 1: Wafer grinding

When the wafer grinding requires the thickness being less than or equal to 160 μm, a PG300RM grinding machine and the conventional grinding process are used to perform grinding on a wafer. A CP9021B-200 dedicated grinding adhesive film with the specification being 230 mm×100 m and the thickness being 200 μm is adopted, and grinding is performed on a surface of the dedicated grinding adhesive film by using the conventional processes of rough grinding, fine grinding, and polishing, so that the surface roughness of the dedicated grinding adhesive film becomes 0.05 μm-0.12 μm, and the dedicated grinding adhesive film after grinding is adhered to a surface of the grinded wafer.

When the wafer grinding requires the thickness being greater than 160 μm, a PG300RM grinding machine and the conventional grinding process are used to perform grinding on a wafer. A BT-150E-KL grinding adhesive film with the specification being 230 mm×100 m and the thickness being 150 μm is adopted, and grinding is performed on a surface of the grinding adhesive film by using the conventional process, so that the surface roughness of the grinding adhesive film becomes 0.05 μm-0.12 μm, and the grinding adhesive film after grinding is adhered to a surface of the grinded wafer.

Step 2: Wafer sawing

Perform wafer sawing on the wafer adhered with the grinding adhesive film in Step 1 according to the thickness required in the wafer grinding in Step 1:

when the grinding thickness of the wafer is less than or equal to 160 μm, perform wafer sawing with a DFD3350 dual-blade dicing saw to prevent fragments, and bake after wafer sawing by using an oven of model ESPEC;

when the grinding thickness of the wafer is greater than 160 μm, perform wafer sawing with a DAD6340 common dicing saw, and bake after wafer sawing by using an oven of model ESPEC.

Step 3: Surface mounting and reflow soldering

The procedure includes: printing solder paste→chip mounting→reflow soldering→material Collecting→cleaning First print solder paste on related pads on the substrate that are used for attaching devices, and attach passive devices, in an ascending order of size, to the pads with the solder paste printed. After all the passive devices are mounted, feed the substrate with the passive devices mounted into a Pyramax reflow oven to perform reflow soldering, where the temperature of reflow is 230° C.-250° C., and the time of reflow is 30s-50s. The substrate adopts an SMT PAD window-opening manner, where the substrate has the specification as that: 0201, indicating a non-solder mask define pad structure, and 0402, indicating a solder mask define pad structure.

The solder past adopts the solder paste of the specification 96.5SN 3AG 0.5CU and produced by SENJU.

A resistor has the specification as that: R0201 4.7 K, 5%, 0.05 W; R0201 10 K, 5%, 0.05 W; R0402 10 K, 1%, 0.05 W.

A capacitor has the specification as that: C0201 100 nf±10%/10 V.

An XPf-s mounter is adopted.

Clean the substrate after reflow by using BL-370 cleaning agent, so as to remove flux residue. During the cleaning, the transporting speed is 0.45 m/min, and the cleaning temperature is 35-45° C. Dry the substrate after cleaning at the temperature of 40-50° C.

Step 4: Place the sawed wafer in Step 2 into a work room of a die bonding machine, and close the door; transfer the substrate cleaned in Step 3 to a loading table, clamp an epoxy (conductive epoxy or non-conductive epoxy) tube, select a suitable dispenser nozzle, place the wafer after wafer sawing on a wafer stage, observe under a microscope, rotate to adjust the position of the wafer, dispense the epoxy at wafer attachment positions by using an epoxy dispensing system (the dimension of the dispenser nozzle is selected according to different chip sizes and different viscosity of the epoxy, and a dispensing pattern is also related to the shapes and sizes of the chips), eject the wafer by using a conventional multi-ejector pin system and multi-step ejection system, and place the wafer at the attach positions on the substrate when the wafer is ejected.

Place the sawed wafer in Step 2 into a work room of a die bonding machine, and close the door; transfer the substrate cleaned in Step 3 to a loading table, clamp an epoxy (conductive epoxy or non-conductive epoxy) tube, select a suitable dispenser nozzle, place the wafer after wafer sawing on a wafer stage, observe under a microscope, rotate to adjust the position of the wafer, dispense the epoxy at wafer attachment positions by using an epoxy dispensing system (the dimension of the dispenser nozzle is selected according to different chip sizes and different viscosity of the epoxy, and a dispensing pattern is also related to the shapes and sizes of the chips), eject the wafer by using a conventional multi-ejector pin system and multi-step ejection system, and place the wafer at the attach positions on the substrate when the wafer is ejected. Preheat the substrate mounted with lower chips by using a DB-700FL or ESEC2008hs3 plus chip bonder, where the preheat temperature is 150° C. A manipulator of the equipment sucks an IC chip provided with the adhesive film, and places the chip to the attachment position on the lower-layer chip in an automatic alignment manner. After one chip is attached, the chip is transferred automatically to a lead magazine for material collection, and all chips in this batch of upper-layer chips are attached in the same manner. The lead magazine having the upper-layer chips attached is transferred to perform baking by using an ESPEC oven at the temperature of 150° C. for 3 hours through an anti-delaminating backing process.

When the chip size is greater than 6 mm×6 mm, problems such as chip misalignment, chip crush, and undesirable resin flow emerge during the die bonding. The resin flow is ensured by controlling the amount of the dispensed epoxy; the position of a detection head is adjusted to solve the problem of chip misalignment; and the lifting height of the manipulator is controller to avoid the chip crush.

During die bonding, the DB-700FL or ESEC 2008hs3 plus chip bonder is adopted, and a low-stress environmental-protection conductive epoxy with the linear expansion coefficient $\alpha \leq 1$ and the viscosity $\geq 8000$ cp.

In addition, the SiP package adopts a Design of Experiment (DOE) to optimize process conditions, and when the chip and a carrier have approximate size ratio, the overflow of silver paste and the precision of chip mounting have higher requirements.

Step 5: Perform cleaning, by using a conventional method and a VSP-88D Pro1 plasma cleaner, on the substrate after die bonding in Step 4.

Step 6: Select a suitable chopper according to sizes of pads and bonding wires of a specific package, the diameter of the bonding wire may be selected randomly among $\Phi 18$ μm, $\Phi 20$ μm, $\Phi 23$ μm, $\Phi 25$ μm, $\Phi$μm, $\Phi 33$ μm, $\Phi 38$ μm, and $\Phi$μm, so as to perform wire bonding.

In a multi-chip lamination structure, first, a high-low loop bonding wire is adopted between an upper-layer chip and a lower-layer chip; next, a flat loop or M-loop bonding wire is adopted between the lower-layer chip and a first pad 6; and finally, a BGA loop bonding wire is adopted between the upper-layer chip and the first pad 6.

It is a very necessary technology to perform long-span and long-distance wiring above the chips, and the cross-chip technology effectively improves the wiring and packaging density.

In this process, in order to obtain better electrical performance parameter, a chip-to-chip technology and the cross-chip wire bonding technology are used, in which the chips are connected through gold wires, thereby effectively reduce the length of the wire and reduce the package area. Meanwhile, by means of loop optimization, sagging, short-circuit and other phenomena of special die to die loops can be avoided. Because the bonding wires have a small gap, it easily causes gold wire offset during the packaging, so as to cause the short circuit; therefore, DOE optimization is performed on loop parameters of the gold wire, so as to control the loop height between 100 m-150 μm, and an optimal loop shape is adopted to enhance the loop strength, thereby improving the bending resistance of the gold wire.

Perform bonding by using an ESEC3100 bonding machine.

Step 7: Use a molding compound with a linear expansion coefficient being $\alpha \leq 1$, viscosity $\geq 8000$ cp, and liquidity being 80 cm-120 cm, and perform molding on the substrate after bonding in Step 6, where during the molding, an automatic molding system with vacuum absorption is used to vacuum-absorb a frame, and the conventional multi-condition injection anti-warping software control technique is applied at the same time to avoid wire sweep, warping, and delaminating during the molding. In a post mold curing procedure, tightly clamp the molded package by using an anti-warping dedicated curing fixture, and perform post mold curing for 4 hours to 7 hours at the temperature of 175° C.+10° C., so as to prepare a whole bar of semi-finished product of the SiP system-integration package.

The molding compound adopts the commonly available CEL9250 molding compound and the commonly available EME EF0324906 molding compound.

The SiP package is a one-sided package with one side being the molding compound and the other side being the substrate. Because the package is not a symmetric package, the materials in the package are inconsistent, and during the molding, the package warps after the temperature changes due to different thermal expansion coefficients and shrinkages of the materials. During the molding, an anti-warping technique controlled by multi-condition injection anti-warping software may control the degree of warping into a process range, and the warping may be corrected by using a dedicated curing fixture in the post mold curing process. Moreover, strict temperature rising and temperature dropping procedures are used to avoid warping due to dramatic change of the temperature. The warping degree is controlled to 0.15 mm (smile), 0.10 mm (cry) by a strict control procedure, thereby satisfying the requirements of sawing.

Package void is one of defects in high-density package. In the present invention, 22 devices and 3 chips are placed in a package of 12×18 mm, all the devices are vertical to a mold flow direction, and have very small gap between the devices. Moreover, by means of package design optimization, the molding parameters are optimized by using the multi-condition injection mold software control process, and techniques such as upper chip vacuumization is used to eliminate the void.

Step 8: Fix, by using a dedicated printing fixture, the whole bar of semi-finished product of the SiP system-integration package manufactured in Step 7, mark characters on the semi-finished product by using LMK-54 marking equipment, and perform inspection by using a dedicated inspection fixture.

When perform character marking by using the LMK-54 marking equipment, a marking template is made first, and stamp positions are adjusted, which may be performed by moving a single stamp, thereby solving the problem in the prior art that the marking is difficult because of deforming and breaking phenomena due to poor material and because of insufficient manufacturing precision of the fixture. The original detection fixture opens one window for four stamps, and such design is disadvantageous in that: first, it is hard to control the size of one stamp; second, it is difficult to adjust the stamp positions and steps between the stamps; third, checks of the fixture are deformed with many severe breaks, the fixture has a poor precision, and the time spent for adjusting the position of one product is about one hour and a half.

Step 9: Cutting

Perform taping, by using MWM-850 taping equipment of the AE Company, on a surface of the whole bar of semi-finished product of the SiP system-integration package after marking in Step 9; cut, by using AD3350 cutting equipment of the DISCO Company, the whole bar of semi-finished product of the SiP system-integration package after taping on the surface; perform cleaning by using DCS 1440 cleaning equipment of the DISCO Company; perform UV irradiation by using UV-956 irradiation equipment of the AE Company; perform picking and sorting; and finally, perform air-drying by using an ion blower.

The taping is performed by using an FC-217M-170UV adhesive film.

The product after cutting has a little copper powder adhered to the surface of the pin or heat sink, which causes foreign bodies on the surface of the product, and results in short circuit between the pins during production. Therefore, the feeding speed is increased during cutting, the time of sewage remaining on the product is reduced as many as possible, and the product is cleaned in time after cutting. A two-fluid cleaner is used and cleaning program parameter setting is optimized, so as to improve the cleaning quality. During the cutting, a correct cutting order must be selected, so as to avoid 2 bars, when cutting at the same time, from being contaminated by the sewage of cutting.

A chip may drop in a small-sized package after being processed, and the solutions include the followings: enhancing the binding strength on the adhesive film by selecting an adhesive film with strong adhesiveness; or controlling the warping degree of the material bar to improve the mounting process, so that the product can be bond with the UV film tightly without any bubble or blister.

In addition, over-cutting may occur during cutting of the small-sized package, and the solutions include the following: selecting a CSP alignment mode and selecting a multi-point alignment function; or changing a cutting order command through programming, so as to change radial stress at different positions, thereby reducing the offset of the product.

Step 10: Packing

Perform packing by using an anti-static vacuum packing process of a common package.

The inventiveness of the manufacturing method of the present invention is well embodied as follows:

Differential impedance technique of key signal is used; void design applied when coating copper in a large area effectively release the stress of molding and high-temperature procedures; moreover, very small devices are used in the design of the substrate, so that a second solder joint for bonding may be optimized; a memory chip, a CPU, an encryption chip and a decoding chip are integrated to have functions of a whole system; the 3D structure and layout in the high-density package avoids SMT from contaminating the second solder joint; and hybrid application of the multi-chip technique and lamination techniques is used. In process, high-density low-pitch solder paste printing technique, high-density low-pitch device mounting technique, and high-temperature reflow soldering technique are applied. As for the die bonding of super-thin chips, the contamination during die bonding of high-density package is solved by using the plasma cleaning technique. During bonding, the chip-to-chip wire bonding technique is adopted, and by means of cross-chip wire bonding, high-density cross loop short circuit is solved, thereby improving the density of wiring and package. In the chip lamination structure, the chip-to-chip technique and cross-chip wire bonding technique are used; the development of ultra-short ultra-low loop solves the problem of bonding wires between the upper-layer and the lower-layer chip; moreover, in the substrate design, it is considered that in the chip lamination structure, the wiring may adopt a backup and multiplexing technique, that is to say, the upper-layer chip may be connected directly through gold wires by using the chip-to-chip technology, and may also be connected on the substrate through gold fingers, thereby ensuring the reliability of the production and the flexibility of the process. In the high-density package, the multi-condition injection mold software control process is used and void design is adopted when coating copper in a large area, so that the stress in molding and high-temperature procedures is released effectively, thereby solving the problems of turbulence, void and warping in the high-density molding. The passive devices are integrated in such manner that the passive devices are placed to keep approximately in parallel with the gold wires, thereby effectively reducing the wire sweep ratio during molding. Signal communication between chips is performed in three manners at the same time: direct connection through the gold wire; gold wire wiring on the substrate and connection through the gold wire; and gold wire wiring on the substrate, gold wire wiring on the passive devices, and connection through the gold wire. The chip attachment area of the substrate is coated with copper in a large area, and a binder containing metal component is used during the chip bond, so as to enhance the heat dissipation of the chip.

Embodiment 1

The wafer grinding requires the thickness being less than or equal to 160 μm, so a PG300RM grinding machine and the conventional grinding process are used to perform wafer grinding on a chip. A CP9021B-200 dedicated grinding adhesive film with the specification being 230 mm×100 m and the thickness being 200 μm is adopted, and grinding is performed on a surface of the dedicated grinding adhesive film by using the conventional processes of rough grinding, fine grinding, and polishing, so that the surface roughness of the dedicated grinding adhesive film becomes 0.05 μm-0.12 μm, and the dedicated grinding adhesive film after grinding is adhered to a surface of the chip after wafer grinding. Perform wafer sawing with a DFD3350 dual-blade dicing saw to prevent fragments, and bake after wafer sawing by using an oven of model ESPEC. A substrate adopting an SMT PAD window-opening manner, with the specification of 0201: non-solder mask define and 0402: solder mask define, is used, 96.5SN 3AG 0.5CU solder paste manufactured by the SENJU is used, a resistor with the specification of R0201 4.7 K, 5%, 0.05 W, a resistor with the specification of R0201 10 K, 5%, 0.05 W; a resistor with the specification of R0402 10 K, 1%, 0.05 W and a capacitor with the specification of C0201 100 nf±10%/10 V are used. An XPf-s chip mounter is used to print the solder paste on related pads on the substrate for attaching devices, and automatically sucks passive devices in an ascending order of size and places the passive devices on the pads printed with the solder paste. After all the passive devices are mounted, feed the substrate with the passive devices mounted into a Pyramax reflow oven to perform reflow soldering, where the temperature of reflow is 230° C. and the time of reflow is 30s. A BL-370 cleaning agent is used to clean the chip after the reflow soldering, so as to remove residual flux, where the transporting speed during the cleaning is 0.45 m/min, and the temperature is 35° C.; after that, the cleaned chip is dried at the temperature of 40° C. Place a wafer frame after sawing into a work room of a DB-700FL die bonding machine, and close the door. Feed the substrate mounted with the passive devices to a loading table, and clamp a conductive epoxy tube. The die bonding machine picks the wafer and places the wafer on a wafer workbench, observes under a microscope, and rotates to adjust the position of the chip. An epoxy dispensing system using a low-stress environmental-protection conductive epoxy with the linear expansion coefficient being al≤1 and the viscosity ≥8000 cp is used to dispense the epoxy at chip mounting positions. A conventional multi-ejector pin system and multi-step ejection system is used, and when the chip is ejected, a manipulator picks the chip to place the chip at the chip mounting position on the substrate accurately, so as to perform chip mounting. Perform plasma cleaning on the substrate mounted with the chips. Select a chopper according to sizes of pads and bonding wires of a specific package, select a gold wire with the diameter being φ18 μm, and use an ESEC3100 bonding machine to perform bonding, where the gold wire loop is controlled to be 100 μm-150 μm. Use a CEL9250 molding compound to perform molding on the substrate after bonding, and during the molding, an anti-warping technique for a super-thin package is used, and the conventional multi-condition injection anti-warping software control technique and upper chip vacuumization technique are used to avoid wire sweep, delaminating due to warping, and mold void. Tightly clamp the molded package by using a conventional anti-warping dedicated curing fixture, and perform post mold curing at the temperature of 175° C. for 7 hours, Perform marking by using LMK-54 marking equipment. Perform taping by using MWM-850 equipment of the AE Company. Perform cutting by using an AD3350 of the DISCO Company. Perform taping by using a DCS1440 of the DISCO Company. Perform UV irradiation by using a UV-956 of the AE Company. Perform picking and sorting by using AEROTAT XC (ionizing air blower) equipment of the SIMCO Company. The UV adhesive film uses FC-217M-170. The feeding speed is increased during cutting to reduce the time of sewage remaining on the product, and the product is cleaned in time after cutting. A two-fluid cleaner is used and cleaning program parameter setting is optimized, so as to improve the cleaning quality. During the cutting, a correct cutting order must be selected, so as to avoid 2 bars, when cutting at the same time, from being contaminated by the sewage of cutting. Perform packing by using an anti-static vacuum packing process of a common package, so as to obtain the SiP system-integration package.

Embodiment 2

The wafer grinding requires the thickness being greater than 160 μm, so a PG300RM grinding machine and the conventional grinding process are used to perform wafer grinding on a chip. A BT-150E-KL dedicated grinding adhesive film with the specification being 230 mm×100 m and the thickness being 200 μm is adopted, and grinding is performed on a surface of the dedicated grinding adhesive film by using the conventional process, so that the surface roughness of the dedicated grinding adhesive film becomes 0.05 μm-0.12 μm, and the dedicated grinding adhesive film after grinding is adhered to a surface of the chip after wafer grinding. Perform wafer sawing with a DAD6340 dicing saw to prevent fragments, and bake after wafer sawing by using an oven of model ESPEC. A substrate adopting an SMT PAD window-opening manner, with the specification of 0201: non-solder mask define and 0402: solder mask define, is used. 96.5SN 3AG 0.5CU solder paste manufactured by the SENJU is used, a resistor with the specification of R0201 4.7 K, 5%, 0.05 W, a resistor with the specification of R0201 10 K, 5%, 0.05 W; a resistor with the specification of R0402 10 K, 1%, 0.05 W and a capacitor with the specification of C0201 100 nf+10%/10 V are used. An XPf-s chip mounter is used to print the solder paste on related pads on the substrate for attaching devices, and automatically sucks passive devices in an ascending order of size and places the passive devices on the pads printed with the solder paste. After all the passive devices are mounted, feed the substrate with the passive devices mounted into a Pyramax reflow oven to perform reflow soldering, where the temperature of reflow is 250° C. and the time of reflow is 50s. A BL-370 cleaning agent is used to clean the chip after the reflow soldering, so as to remove residual flux, where the transporting speed during the cleaning is 0.45 m/min, and the temperature is 45° C.; after that, the cleaned chip is dried at the temperature of 50° C. Place a wafer frame after sawing into a work room of an ESEC 2008hs3 plus die bonding machine, and close the door. Feed the substrate mounted with the passive devices to a loading table, and clamp a non-conductive epoxy tube. The die bonding machine picks the wafer and places the wafer on a wafer workbench, observes under a microscope, and rotates to adjust the position of the chip. An epoxy dispensing system using a low-stress environmental-protection conductive epoxy with the linear expansion coefficient being all and the viscosity ≥8000 cp is used to dispense the epoxy at chip mounting positions. A conventional multi-ejector pin system and multi-step ejection system is used, and when the chip is ejected, a manipulator picks the chip to place the chip at the chip mounting position on the substrate accurately, so as to perform chip mounting. Perform plasma cleaning on the substrate mounted with the chips. Select a chopper according to sizes of pads and bonding wires of a specific package, select a gold wire with the diameter being Φ50 μm, and use an ESEC3100 bonding machine to perform bonding, where the gold wire loop is controlled to be 100 μm-150 μm Use a EME EF0325906 molding compound to perform molding on the substrate after bonding, and during the molding, an anti-warping technique for a super-thin package is used, and the conventional multi-condition injection anti-warping software control technique and upper chip vacuumization technique are used to avoid wire sweep, delaminating due to warping, and mold void. Tightly clamp the molded package by using a conventional anti-warping dedicated curing fixture, and perform post mold curing at the temperature of 185° C. for 4 hours. Perform marking by using LMK-54 marking equipment. Perform taping by using MWM-850 equipment of the AE Company. Perform cutting by using an AD3350 of the DISCO Company. Perform taping by using a DCS1440 of the DISCO Company. Perform UV irradiation by using a UV-956 of the AE Company. Perform picking and sorting by using AEROTAT XC (ionizing air blower) equipment of the SIMCO Company. The UV adhesive film uses FC-217M-170. The feeding speed is increased during cutting to reduce the time of sewage remaining on the product, and the product is cleaned in time after cutting. A two-fluid cleaner is used and cleaning program parameter setting is optimized, so as to improve the cleaning quality. During the cutting, a correct cutting order must be selected, so as to avoid 2 bars, when cutting at the same time, from being contaminated by the sewage of cutting. Perform packing by using an anti-static vacuum packing process of a common package, so as to obtain the SiP system-integration package.

Embodiment 3

In a multi-layer stacked package, a lower-layer chip is ground to the thickness of 100 μm-150 μm, and an upper-layer chip is grounded to the thickness of 75 μm-120 μm, a grinding machine has a function of 8"-12" super-thin grinding and polishing, and uses an anti-warping thin-grinding and thin-polishing process. The taping, cutting, chip mounting and reflow soldering the same as those in Embodiment 1 are used, the cleaning temperature after the reflow soldering is 40° C., and perform drying at the temperature of 45° C. Perform die bonding in the embodiment of Embodiment 1 by using a DB-700FL die bonding machine. Preheat the substrate mounted with the lower-layer chips to the temperature of 150° C. A manipulator sucks an IC chip provided with an adhesive film, and automatically places the IC chip to a chip mounting position on the lower-layer chip. After one chip is mounted, the chip is transferred automatically to a lead magazine for material collection, and all chips in this batch of upper-layer chips are attached in the same manner. The lead magazine having the upper-layer chips mounted is transferred to perform baking by using an ESPEC oven at the temperature of 150° C. for 3 hours through an anti-delaminating backing process. Perform plasma cleaning by using the method the same as that in Embodiment 1. A high-low loop bonding wire is adopted between the upper-layer chip and the lower-layer chip, a flat loop bonding wire is adopted between the lower-layer chip and a first pad 6, and finally, a BGA loop bonding wire is adopted between the upper-layer chip and the first pad 6. Perform molding on the substrate finishing the soldering of the bonding wire. During the molding, the multi-condition injection anti-warping software control technique and Design of Experiment (DOE) are used to optimize the process, thereby controlling the wire sweep, warping, and delaminating. Perform post mold curing at the temperature of 165° C. for 5.5 hours, so as to prepare a whole bar of semi-finished product of the SiP system-integration package. Subsequent processes are performed by using the method in Embodiment 1, so as to prepare the SiP system-integration package.

What is claimed is:

1. A system-in-package (SiP) system-integration integrated circuit (IC) chip package, comprising:
   a substrate;
   a passive device;
   a first and a second IC chips provided on a first surface of the substrate;
   a mold cap covering the first surface of the substrate and enclosing all devices disposed on the first surface; and
   two pads disposed on a second surface opposing the first surface of the substrate,
   wherein an adhesive film is disposed between each of the IC chips and the substrate, the adhesive film is a die attach film;
   wherein multiple first bonding wires are soldered on the first IC chip, each of the multiple first bonding wires has one end fixed to the first IC chip and the other end soldered to pads provided on the first surface of the substrate at both sides of the first IC chip;
   wherein multiple second bonding wires are soldered on the second IC chip, each of the multiple second bonding wires has one end fixed to the second IC chip and the other end soldered to pads provided on the first surface of the substrate at both sides of the second IC chip;
   wherein an IC chip attachment area of the substrate is coated with copper, and a binder containing a metal component is used during the IC chip bond; and
   wherein the substrate adopts an SMT PAD window-opening manner, the substrate has the specification as follows: a 0201, indicating a non-solder mask defined pad structure, and 0402, indicating a solder mask defined pad structure.

2. The system-in-package (SiP) system-integration integrated circuit (IC) chip package according to claim 1, wherein the IC chips are separated by a passive device that is provided on the first surface of the substrate and between the IC chips.

3. A system-in-package (SiP) system-integration integrated circuit (IC) chip package, comprising:
   a substrate;
   a passive device;
   lower-layer IC chips provided on a first surface of the substrate;
   an upper-layer IC chip stacked on one of the lower-layer IC chips;
   a mold cap covering the first surface of the substrate and enclosing all devices disposed on the first surface; and
   two pads disposed on a second surface opposing the first surface of the substrate,
   wherein an adhesive film is disposed between each of the lower-layer IC chips and the first surface of the substrate, a tape is disposed between the upper-layer IC chip and the lower-layer IC chip on which the upper-layer is stacked, the adhesive film is a die attach film;
   wherein a solder ball is disposed on the lower-layer IC chip on which the upper-layer IC chip is stacked;
   wherein a high-low loop bonding wire is adopted between the upper-layer IC chip and the lower-layer IC chip on which the upper-layer IC chip is stacked, a flat loop or a M-loop bonding wire is adopted between the lower-layer IC chip and a pad provided on the first surface of the substrate, a BGA loop bonding wire is adopted between the upper-layer IC chip and a pad provided on the first surface of the substrate;
   wherein an IC chip attachment area of the substrate is coated with copper, and a binder containing a metal component is used during the IC chip bond;
   wherein the substrate adopts an SMT PAD window-opening manner, the substrate has the specification as follows: a 0201, indicating a non-solder mask defined pad structure, and 0402, indicating a solder mask defined pad structure; and
   wherein the lower-layer IC chips are grounded to a thickness of 100 µm-150 µm, the upper-layer IC chip is grounded to a thickness of 75 µm-120 µm.

4. The system-in-package (SiP) system-integration integrated circuit (IC) chip package according to claim 3, wherein the lower-layer IC chips provided on the substrate are separated by a passive device that is provided on the first surface of the substrate and between the lower-layer IC chips.

* * * * *